United States Patent
Pio et al.

(10) Patent No.: US 6,737,715 B2
(45) Date of Patent: May 18, 2004

(54) FIELD-EFFECT TRANSISTOR AND CORRESPONDING MANUFACTURING METHOD

(75) Inventors: Federico Pio, Brugherio (IT); Paola Zuliani, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/090,978

(22) Filed: Mar. 4, 2002

(65) Prior Publication Data

US 2002/0089006 A1 Jul. 11, 2002

Related U.S. Application Data

(62) Division of application No. 09/442,834, filed on Nov. 18, 1999.

(30) Foreign Application Priority Data

Nov. 19, 1998 (EP) .............................................. 98830694

(51) Int. Cl.$^7$ ................................................ H01L 29/76
(52) U.S. Cl. ...................................... 257/404; 257/391
(58) Field of Search ................................ 257/404, 391, 257/392

(56) References Cited

U.S. PATENT DOCUMENTS

| 4,114,255 | A |   | 9/1978  | Salsbury et al. ............... 29/571   |
| 4,549,336 | A | * | 10/1985 | Sheppard Douglas P. ... 438/278         |
| 4,577,394 | A |   | 3/1986  | Peel ......................... 29/576 W  |
| 4,735,914 | A |   | 4/1988  | Hendrickson et al. ......... 437/44      |
| 5,240,874 | A |   | 8/1993  | Roberts ....................... 437/69   |
| 5,814,861 | A |   | 9/1998  | Schunke et al. ............ 257/336      |
| 6,232,642 | B1 | * | 5/2001 | Yamazaki .................... 257/404    |

FOREIGN PATENT DOCUMENTS

| EP | 0384275 A3   |   | 8/1990  |
| EP | 0384275 A2   |   | 8/1990  |
| EP | 0 442 413 A2 | * | 8/1991  |
| GB | 2022922 A    |   | 12/1979 |
| JP | 403218070 A  | * | 9/1991  |
| JP | 07249699     |   | 9/1995  |

* cited by examiner

Primary Examiner—Douglas Wille
(74) Attorney, Agent, or Firm—Lisa K. Jorgenson; Robert Iannucci; Seed IP Law Group PLLC

(57) ABSTRACT

A field effect transistor having a variable doping profile is presented. The field effect transistor is integrated on a semiconductor substrate with a respective active area of the substrate including a source and drain region. A channel region is interposed between the source and drain regions and has a predefined nominal width. The effective width of the channel region is defined by a variable doping profile.

17 Claims, 1 Drawing Sheet

FIELD-EFFECT TRANSISTOR AND CORRESPONDING MANUFACTURING METHOD

CROSS-REFERENCE TO RELATED APPLICATION

This application is a divisional of U.S. patent application Ser. No. 09/442,834, filed Nov. 18, 1999, now pending, which application is incorporated herein by reference in its entirety.

BACKGROUND OF THE INVENTION

1. Field of the Invention

The present invention relates to an improved field effect transistor, and more specifically to a field effect transistor having a variable doping profile.

2. Description of the Related Art

In particular but not exclusively, the invention relates to a field effect transistor which operates at high voltages, this transistor being formed on a semiconductor substrate and integrated with a well of N or P type and the description which follows is made with reference to this field of application with the only objective of simplifying the description.

As is well known, in the manufacturing of integrated circuit devices, in particular EEPROM memories, that need high internal programming voltages, the need comes up to integrate on the same chip transistors having low threshold voltage $V_T$ and low body factor.

A first known technical solution for manufacturing transistors with such features is that of reducing the doping of the substrate or, of the well in which these devices are formed. To this end "natural" transistors may be formed, that is without the use of additional doping implants on the semiconductor substrate where they are formed.

Although the technical problem is resolved, this first solution presents various drawbacks; in fact, in order to form these transistors with a low threshold voltage, it is necessary to introduce at least an additional mask in the standard process flows for the manufacture of the CMOS transistors. For instance, with the intention of masking the substrate portion where these transistors need to be formed.

Further on, to ensure the reliability of the parasitic field transistors that are formed between a portion of substrate in which these natural transistors are formed and a portion adjacent thereto, an insulating implant of P-iso (N-iso) type is usually formed on the entire active area, which requires a dedicated mask.

Associated with this kind of solution are further drawbacks such as: a large waste of area for guaranteeing a high enough threshold voltage of the parasitic transistor; and the threshold voltage of the "natural" transistors is determined by the doping of the substrate.

In advanced processes substrates with low doping (or epitaxial substrates) are used which result in threshold voltages of the "depletion" active transistor; the introduction of an additional mask is necessary for performing an insulating implant P distinct from the P-well implant (or for differentiating the doping of the N-well implant in which the p-channel transistors are formed).

To modify the threshold voltage of such natural transistors (for example in order to obtain $V_T>0$) two possibilities are given: an implant dedicated to the correction of the threshold voltage, that however needs a further dedicated mask with the increase of the costs of manufacturing; or a blanket implant, that is without masking, to which, anyway, a reduction in the mobility of the complementary transistors (for example p-ch) is associated.

Further on, in some applications the use of more transistors is foreseen, with threshold voltages which differ of a small amount (for example $\Delta V_T \cong 100$ mV), which can be preferably defined according to the specific application (that is of the sub-circuit in which the transistor is inserted).

According to the prior art such result can be obtained by means of further implants for the adjustment of the threshold voltage of each transistor, each one requiring however a dedicated mask.

BRIEF SUMMARY OF THE INVENTION

Embodiments of the invention include a field effect transistor having structural and functional features so as to free the threshold voltage from the process parameters by intervening only on the structure layout in such a way to overcome the limitations and the drawbacks that still limit the transistors manufactured according to the prior art.

Presented is a method of manufacturing a field effect transistor whose channel width is defined by a variable doping profile, which can be modified through changes in the layout of the structure. In order to obtain this variable doping profile, after the definition of the transistor active area, a mask is formed of greater width than the width of the active area; an external implant of doping is then carried out outside the transistor active area. Following the side diffusion of the doping due to thermal treatments, the doping profile along the width of the channel region of the transistor is modified and hence its threshold voltage.

The features and the advantages of the transistor according to the invention will become clear from the following description, of an embodiment thereof, which is herein given as example for illustrative and not limiting purposes with reference to the attached drawings.

DETAILED DESCRIPTION OF THE INVENTION

Figures 1, 2:
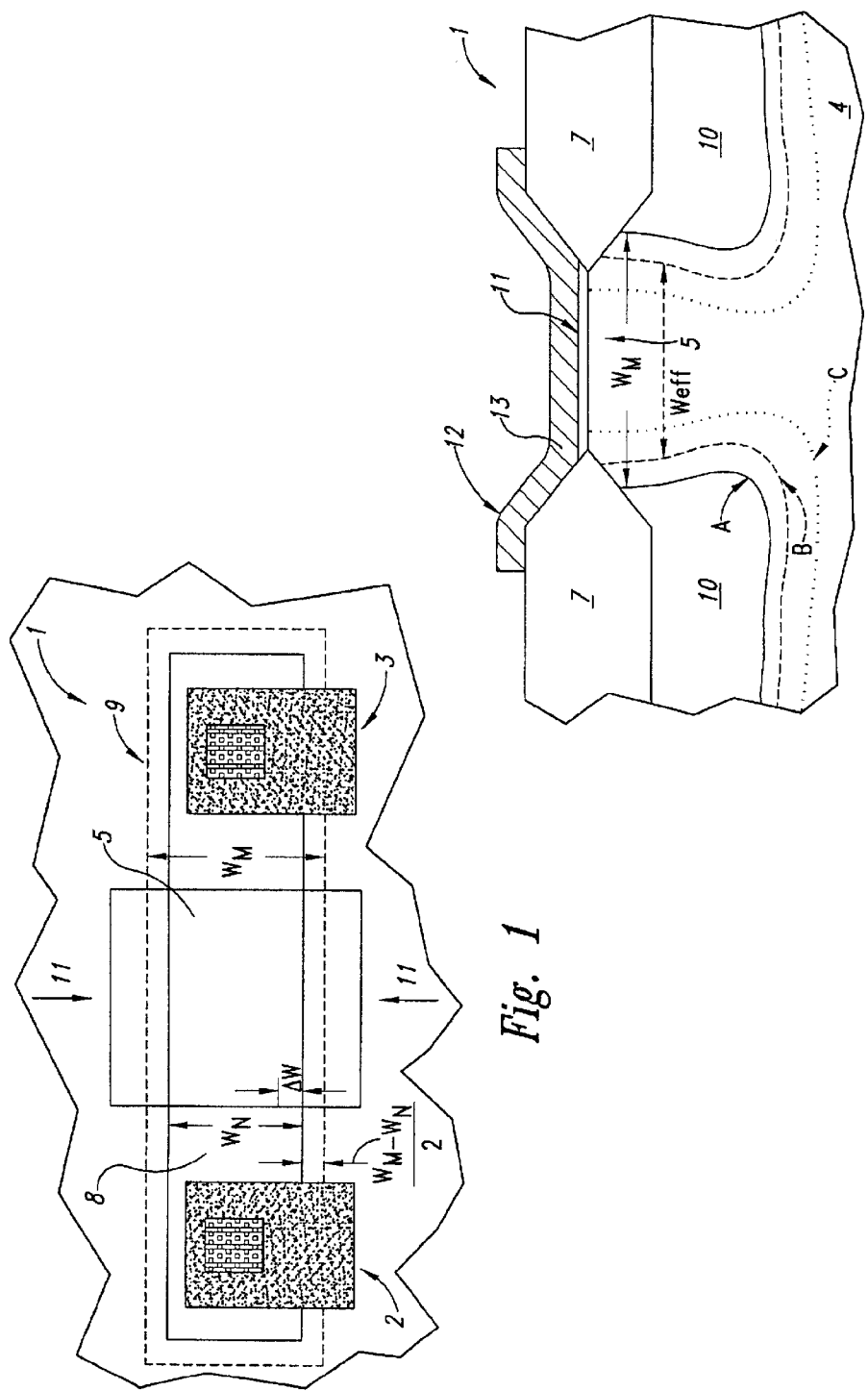
FIG. 1 is a layout view of a portion of a semiconductor substrate on which an embodiment of a field effect transistor according to the present invention is integrated.
FIG. 2 is a cross-sectional diagram, along the line II of FIG. 1, of the channel of the transistor according to the embodiment of the invention shown in FIG. 1.

With reference to such Figures, a method is now disclosed for manufacturing field effect transistor 1 having a width of a channel region 5 defined by a variable doping profile.

The process steps and the structures described hereinbelow do not form a complete process flow for the manufacture of integrated circuits. The present invention can be put into practice together with the techniques for manufacturing integrated circuits used at the moment in the field, and only those commonly used process steps which are necessary for the comprehension of the present invention are included. Discussion of steps or processes well known to those skilled in the art has been abbreviated or eliminated for brevity.

The description which follows is reported with reference to a preferred example of embodiment with N-channel field effect transistors. For P-channel transistors, the types of conductivity that will be mentioned in the following shall be inverted.

The manufacturing of this type of transistors according embodiments of the present invention is particularly advantageous, when they are integrated onto a semiconductor substrate for example of P-type, and, in order to simplify the disclosure the following description relates to this particular field of application.

According to this embodiment of the invention, the MOS field effect transistor 1 is manufactured on a respective active area 8 of a predetermined nominal width W.

Such active area 8 comprises, in a known way, a portion of a semiconductor substrate 4 and is delimited by a layer 7 of insulating oxide. Inside the active area 8, a source region 2 and a drain region 3 are separated from one another by a portion of substrate 4 called channel region 5. The nominal width W of the channel region 5 is equal to the nominal length of the active area 8.

A gate region 13, formed by patterning a layer 12 of polysilicon is placed above the channel region 5 and is separated therefrom by means of a thin layer 11 of gate oxide. A well 10, for example of P type, is formed underneath the insulating layer 7 of oxide and surrounds the active area 8 of the transistor 1.

In particular, the well 10 is implanted at a distance equal to $(W_M-W_N)/2$ of the active area 8 in the direction of the width of the channel region 5, wherein W, is the width of a mask 9 used for realizing the implanted region 10.

As a consequence of the side diffusion of the dopant used for forming the well 10, doping is obtained for the effective width $W_{eff}$ of the channel region 5 that varies with concentration starting from the edge of the well 10 (profile A in FIG. 2) towards the center of the channel region (profiles B and C).

In this way, a parallel configuration is obtained of a series of transistors with infinitesimal differences in width dW at an infinitesimally different threshold voltages, the concentration of which progressively decreases from the edge to the center of the channel.

The effective width $W_{eff}$ of the channel region 5 is also a function of the distance $(W_M-W_N)/2$ of the region 10 implanted in the active area 8 and of the width $W_N$ of the active area 8.

According to an embodiment of the invention, as the effective width $W_{eff}$ of the channel region 5 varies, and therefore as the distance from the active region 8 varies at which the well 10 is formed, so varies the doping profile of the width $W_{eff}$ of the channel region 5 of the transistor, and therefore its threshold voltage $V_T$.

The process steps for manufacturing the transistors according to embodiments of the invention are now described.

On the surface of a semiconductor substrate 4 of P-type, a thick layer 7 of oxide is selectively formed for defining an active area 8 on which the transistor 1 is formed.

As mentioned, such active area 8 has a nominal length that determines the nominal width of the channel region 5 of the transistor 1.

At this point, process steps are carried out in order to form the CMOS transistors in respective wells 10, for example of P-type, formed in the substrate 4. In a known way, a mask, for example of Pwell type, is formed on the semiconductor substrate 4, for example of P type.

According to this embodiment of the invention, this Pwell mask comprises a portion 9 of mask that covers the active area 8. This portion 9 has a width $W_M$ at least greater than the width $W_N$ of the active area 8.

Therefore an implant of P type is carried out in order to form the well 10 with a greater concentration than that of the substrate. Advantageously, thermal processes are carried out in order to let the implanted dopant of P type diffuse.

The profiles A, B and C of doping in FIG. 2 illustrate the side diffusion of the dopant after the implantation and after the application of the thermal processes to the well 10.

As a consequence of the side diffusion of the dopant used for forming the well 10, the doping of the effective width $W_{eff}$ of the channel region 5 is obtained that continuously varies from the edge of the well 10 towards the center of the channel region 5.

In particular, as the implanted region is of P type, the doping profile increases continuously from the center of the channel region 5 up to the edge of the active area 8.

Nothing prevents the implanted region 10 from being of N type; in such a case, the doping profile decreases with continuity from the center of the channel region 5 to the edge of the active area 5.

The distance between the two profiles A that delimit the width of the channel obviously depends on the width $W_M$ of the mask 9.

As the width $W_M$ of the mask 9 varies, so varies the doping profile as defined by the width $W_{eff}$ of the channel region 5 and hence the threshold voltage $V_T$ of the transistor 1 vary.

The process is completed by subsequent, conventional steps, which permit to realize: anti-punchthrough implants, implants for the correction of threshold voltage and all the further implants for the correction of threshold voltage; the formation of a layer 11 for defining gate oxides; the deposition of a layer of polysilicon 12 which is afterwards shaped for defining the gate regions 12; the implant of source region 2 and of drain 3 which are doped as N-type; intermediate dielectrics; lines of metallization; layers of passivation.

Speaking in broader terms, in order to modify the threshold voltage $V_T$ of a transistor 1 manufactured according to an embodiment of the invention, it is sufficient to add to the known steps of the manufacturing steps of CMOS transistors, a mask of bigger dimension than the active area 8 of the transistor 1 as a function of the desired threshold voltage $V_T$, in such a way to obtain the appropriate doping profile of the width of the channel. The mask itself is already present in the CMOS process—only the level layout is modified.

Further on, by manufacturing the transistors 1 with the method according to embodiments of the invention, it is possible to form in the same integrated circuit, transistors obtained with the same sequence of implants and hence masks, but with a different doping profile for the channel and hence different threshold voltages $V_T$.

Advantageously, it is possible to obtain transistors 1 with different threshold voltage, even of a same first width, if a circuit solution is used that allows to connect in parallel two or more transistors with a second width smaller than the first width; once defined the end value for the width, such value can be divided in the parallel of a variable number of transistors, the side dimension of which determines the value of the final threshold voltage.

To sum up, by varying the value of the effective width $W_{eff}$ of the transistor 1, its threshold voltage $V_T$ is directly varied, without modifying the process steps for manufacturing the CMOS transistors.

Further on, the effective width $W_{eff}$ being equal, it is as well possible to obtain different values for the threshold voltage, by employing the parallel of more transistors 1.

From the foregoing it will be appreciated that, although specific embodiments of the invention have been described herein for purposes of illustration, various modifications may be made without deviating from the spirit and scope of the invention. Accordingly, the invention is not limited except as by the appended claims.

We claim:

1. A field effect transistor integrated on a semiconductor substrate having an active area, the field effect transistor comprising:
   a source region and a drain region formed in the semiconductor substrate;
   a channel region interposed between said source and drain regions having a predefined nominal width in a first direction that is perpendicular to a second direction that extends through the source, drain, and channel regions; and
   first and second doped regions formed in the substrate on opposite sides of the channel region, the first and second doped regions defining a variable doping profile in the first direction, the channel region having an effective width defined by the variable doping profile in the first direction.

2. The field effect transistor according to claim 1, wherein the doped regions are part of a continuous doped region that completely surrounds the source, drain, and channel regions.

3. The field effect transistor according to claim 2, wherein the effective width is a function of a distance of the continuous doped region from an active area that includes the source, drain, and channel regions.

4. The field effect transistor according to claim 1, wherein the doping profile has a minimum of concentration at a center of the channel region.

5. The field effect transistor according to claim 1, wherein the doping profile increases with continuity from a center of the channel region to an edge of the channel region.

6. A transistor structure, comprising:
   a first field effect transistor integrated on a semiconductor substrate having an active area, the first field effect transistor including:
      a source region and a drain region formed in the semiconductor substrate; and
      a channel region interposed between said source and drain regions having a predefined nominal width in a first direction that is perpendicular to a second direction that extends through the source, drain, and channel regions, the channel region having a first effective width defined by a variable doping profile in the first direction, the variable doping profile being defined by first and second doped regions on opposite sides of the channel region; and
   a second field effect transistor coupled in parallel to the first field effect transistor, the second field effect transistor having a second effective width.

7. The field effect transistor of claim 6 wherein the second effective width of the second field effect transistor is smaller than the first effective width of the first field effect transistor.

8. The field effect transistor of claim 6 wherein the second effective width of the second field effect transistor is the same as the first effective width of the first field effect transistor.

9. A field effect transistor comprising:
   an active area formed in a semiconductor substrate;
   a source region and a drain region formed in the active area;
   a channel region interposed between said source and drain regions and having a first nominal width in a first direction that is perpendicular to a second direction that extends through the source, drain, and channel regions; the channel region having a variable doping profile in the semiconductor substrate extending in the first direction from no additional dopant in a center of the channel region to a concentrated amount of dopant at edges of the channel region, wherein an effective channel width of the channel region is relative to an amount and concentration of dopant in the channel region;
   a first doped region formed in the substrate extending along an entire first side of the active area from a position beyond the source region in the second direction to a position beyond the drain region in the second direction; and
   a second doped region formed in the substrate extending along an entire second side of the active area from a position beyond the source region in the second direction to a position beyond the drain region in the second direction, the second side being opposite to the first side.

10. The field effect transistor of claim 9, wherein the variable doping profile is one of a doped region implanted adjacent to the transistor.

11. The field effect transistor of claim 10, wherein the effective channel width is a function of a distance between the doped region and the active area.

12. The field effect transistor of claim 9, wherein the doping profile decreases with continuity from the edge of the active area to the center of the channel region.

13. The field effect transistor of claim 1 wherein the field effect transistor is a first field effect transistor, further comprising a second field effect transistor coupled in parallel to the first field effect transistor, the second field effect transistor having a second effective width.

14. The field effect transistor of claim 13 wherein the second effective width of the second field effect transistor is smaller than the effective width of the first field effect transistor.

15. The field effect transistor of claim 13 wherein the second effective width of the second field effect transistor is the same as the effective width of the first field effect transistor.

16. The field effect transistor of claim 9 wherein the first and second doped regions extend beyond third and fourth sides of the active area, the third and fourth sides being opposite to each other and transverse to the first and second sides.

17. The field effect transistor of claim 16, wherein the effective channel width is a function of a distance between the first and second doped regions.

* * * * *